(12) United States Patent
Nishimizu et al.

(10) Patent No.: US 8,605,070 B2
(45) Date of Patent: Dec. 10, 2013

(54) OPERATIONAL AMPLIFIER AND DISPLAY PANEL DRIVING DEVICE (75) Inventors: Manabu Nishimizu, Oita (JP); Atsushi Hirama, Tokyo (JP); Koji Higuchi, Ibaraki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 911 days.

(21) Appl. No.: 12/620,380

(22) Filed: Nov. 17, 2009

(65) Prior Publication Data
US 2010/0123705 A1 May 20, 2010

(30) Foreign Application Priority Data
Nov. 20, 2008 (JP) .................................. 2008-296952

(51) Int. Cl.
*G09G 5/00* (2006.01)
(52) U.S. Cl.
USPC ......................................................... 345/211
(58) Field of Classification Search
None
See application file for complete search history.

(56) References Cited

U.S. PATENT DOCUMENTS

| 5,973,660 | A | 10/1999 | Hashimoto | |
|---|---|---|---|---|
| 6,424,219 | B1 * | 7/2002 | Kato | 330/255 |
| 2006/0284806 | A1 * | 12/2006 | Maki | 345/89 |
| 2008/0204386 | A1 * | 8/2008 | Park | 345/84 |

FOREIGN PATENT DOCUMENTS

| JP | 10-062744 | | 3/1998 |
| JP | 11-305735 | A | 11/1999 |
| JP | 2008116654 | | 5/2008 |
| JP | 2008-296952 | | 12/2008 |

* cited by examiner

*Primary Examiner* — Christopher R Lamb
(74) *Attorney, Agent, or Firm* — Taft Stettining & Hollister LLP (57) ABSTRACT

An operational amplifier includes an output circuit and a differential circuit. The output circuit outputs a voltage in a voltage range determined either from a highest voltage that is an upper limit of a predetermined power source range, or from a lowest voltage that is a lower limit of the predetermined power source range, to an intermediate voltage that is a voltage between the highest voltage and the lowest voltage. The differential circuit includes a first MOS transistor to which a driving signal for driving a display panel is input and a second MOS transistor to which a given input signal is input. The first MOS transistor and the second MOS transistor are connected in parallel, and a differential input-permissible-range of the differential circuit is wider than the voltage range of the output circuit.

12 Claims, 8 Drawing Sheets

PATENT

OPERATIONAL AMPLIFIER AND DISPLAY PANEL DRIVING DEVICE

CROSS-REFERENCE TO RELATED APPLICATIONS

This application is based on and claims priority under 35 U.S.C. §119 from Japanese Patent Application No. 2008-296952 filed on Nov. 20, 2008, the disclosure of which is incorporated by reference herein.

RELATED ART

1. Field of the Disclosure

The present disclosure relates to an operational amplifier and to a driving device for a display panel, and in particular to a display panel driving device of a liquid crystal panel or the like, and an operational amplifier employed in such a driving device.

2. Description of the Related Art

Conventionally, when driving display panels, such as liquid crystal panels, display driving has been performed by applying a voltage to a liquid crystal panel, in accordance with a graduation (gray) level of image data. In such cases, in order to prevent deterioration of the characteristics of the liquid crystal materials, the voltage applied to the liquid crystal is generally voltage inverted with a constant periodicity.

For example, a liquid crystal driving circuit provided with a high voltage side amplifier and a low voltage side amplifier is described in Japanese Patent Application Laid-Open (JP-A) No. 10-62744.

According to JP-A No. 10-62744, the voltage ranges of the high voltage side amplifier and the low voltage side amplifier are narrower in comparison to a case where the amplifiers are not assigned to the high voltage side and the low voltage side, and therefore the power consumption can be reduced.

Figure 7:
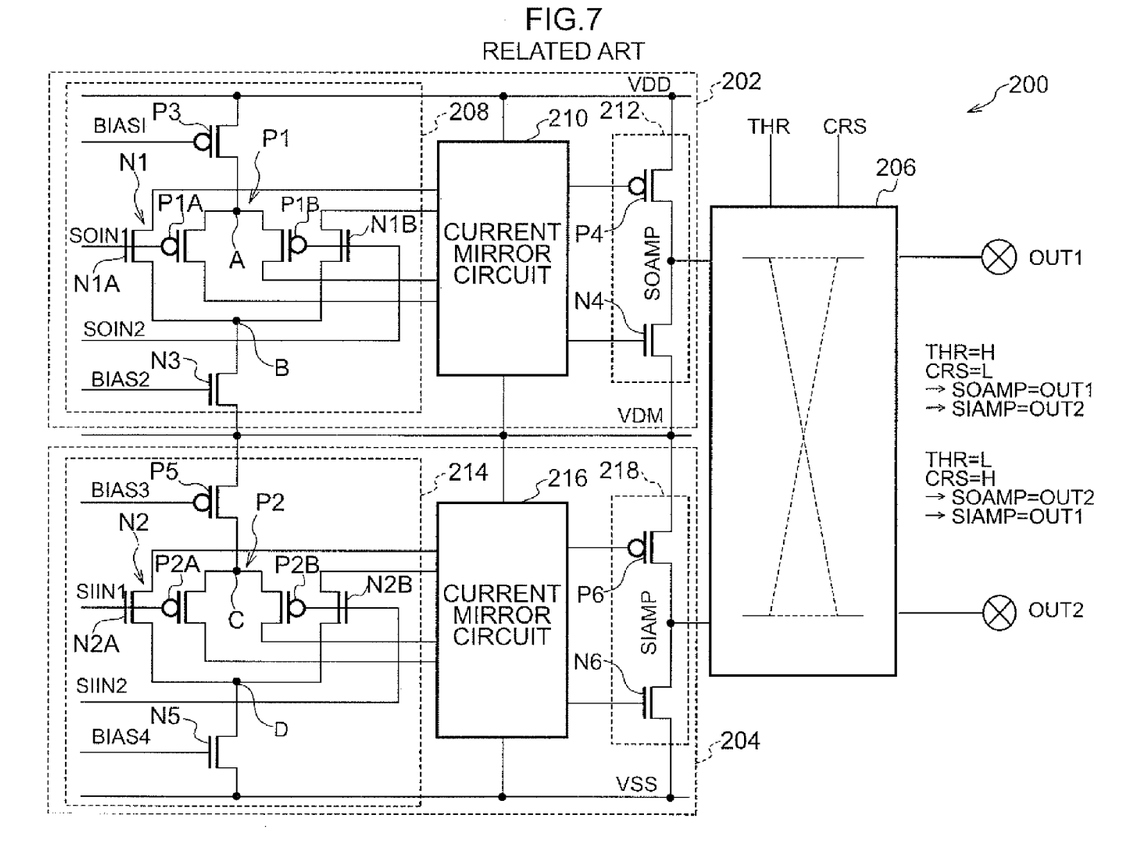
FIG. 7 is circuit diagram of a source amplifier and a sink amplifier according to conventional configuration.

An example of such a driving circuit is shown FIG. 7. A driving circuit 200 of a display panel, shown in FIG. 7, includes: a source amplifier 202 that is a high voltage side amplifier outputting a voltage in a positive polarity output range having an upper limit of VDD, this being the highest voltage of the power source range of the driving circuit, and a lower limit of an intermediate voltage VDM, this being an intermediate voltage between the VDD and VSS (ground), which is the lowest voltage of the power source range; a sink amplifier 204 that is a low voltage side amplifier outputting a voltage in a negative polarity output range having a lower limit of voltage VSS and an upper limit of voltage VDM; and a switch 206.

The source amplifier 202 includes a differential circuit 208, a current mirror circuit 210, and an output circuit 212.

The differential circuit 208 includes a differential pair P1 of PMOS transistors P1A and P1B connected in parallel to the current mirror circuit 210, a differential pair N1 of NMOS transistors N1A and N1B connected in parallel to the current mirror circuit 210, a PMOS transistor P3, and an NMOS transistor N3.

A positive polarity brightness electrical potential in accordance with image data is applied as an input signal voltage SOIN1 to the gates of the NMOS transistor N1A and the PMOS transistor P1A. A specific input signal voltage SOIN2 is input to the gates of the NMOS transistor N1B and the PMOS transistor P1B. For example, an output terminal of the source amplifier 202 may be connected to the gates of the NMOS transistor N1B and the PMOS transistor P1B. An output signal SOAMP from this output terminal is applied, as an input signal voltage SOIN2, to the gates of the NMOS transistor N1B and the PMOS transistor P1B. In such a case, the source amplifier 202 functions as a so-called voltage follower.

A specific bias voltage BIAS1 is applied to the gate of the PMOS transistor P3, and the voltage VDD is applied to the source of the PMOS transistor P3, and the drain of the PMOS transistor P3 is connected to a connection point A of the PMOS transistors P1A and P1B.

A specific bias voltage BIAS2 is applied to the gate of the NMOS transistor N3, and the drain of the NMOS transistor N3 is connected to a connection point B of the NMOS transistors N1A and N1B, and the voltage VDM is applied to the source of the NMOS transistor N3.

Since the current mirror circuit 210 is of a general circuit configuration, explanation thereof will be omitted. The output circuit 212 is configured with a PMOS transistor P4 and an NMOS transistor N4 connected in series. The voltage VDD is applied to the source of the PMOS transistor P4, and the voltage VDM is applied to the source of the NMOS transistor N4. "Connected in series" here means that the drain of the PMOS transistor P4 and the drain of the NMOS transistor N4 are connected together in series.

The sink amplifier 204 includes a differential circuit 214, a current mirror circuit 216 and an output circuit 218.

The differential circuit 214 includes a differential pair P2 of PMOS transistors P2A and P213 connected in parallel to the current mirror circuit 216, a differential pair N2 of NMOS transistors N2A and N2B connected in parallel to the current mirror circuit 216, a PMOS transistor P5, and an NMOS transistor N5.

A negative polarity brightness electrical potential in accordance with image data is applied, as an input signal voltage SIIN1, to the gates of the NMOS transistor N2A and the PMOS transistor P2A. A specific input signal voltage SIIN2 is input to the gates of the NMOS transistor N2B and the PMOS transistor P2B. For example, an output terminal of the sink amplifier 204 may be connected to the gates of the NMOS transistor N2B and the PMOS transistor P2B. An output signal STAMP from this output terminal is applied, as an input signal voltage SIIN2, to the gates of the NMOS transistor N2B and the PMOS transistor P2B. In such a case, the sink amplifier 204 functions as a so-called voltage follower.

A specific bias voltage BIAS3 is applied to the gate of the PMOS transistor P5, the voltage VDM is applied to the source of the PMOS transistor P5, and the drain of the PMOS transistor P5 is connected to a connection point C of the PMOS transistors P2A and P2B.

A specific bias voltage BIAS4 is applied to the gate of the NMOS transistor N5, and the drain of the NMOS transistor N5 is connected to a connection point D of the NMOS transistors N2A and N2B, and the voltage VSS (ground) is applied to the source of the NMOS transistor N5.

Since the current mirror circuit 216 is of a general circuit configuration, explanation thereof will be omitted. The output circuit 218 is configured with a PMOS transistor P6 and an NMOS transistor N6 connected in series. The voltage VDM is applied to the source of the PMOS transistor P6, and the voltage VSS is applied to the source of the NMOS transistor N6.

Figure 8A:
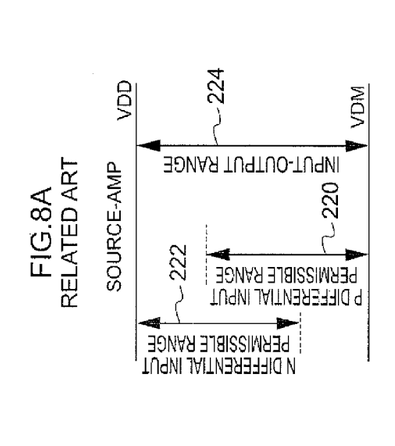
FIG. 8A is a figure showing an input-permissible-range of a differential circuit of a conventional source amplifier and input-output ranges of the source amplifier.

However, in the driving circuit 200 as shown in FIG. 7, as shown in FIG. 8A, an input-permissible-range 220 of the differential pair P1 of the source amplifier 202 and an input-permissible-range 222 of the differential pair N1 is narrower relative to an input-permissible-range 224 of the source amplifier 202. Consequently, as in the drive circuit 200 as shown in FIG. 7, the differential circuit 208 should be configured with the two differential pairs of the differential pairs P1 and N1, and the output voltage of the source amplifier 202 is required to be of a so-called rail-to-rail type, in which the output voltage of the source amplifier 202 up to the full source voltage can be extracted.

Figure 8B:
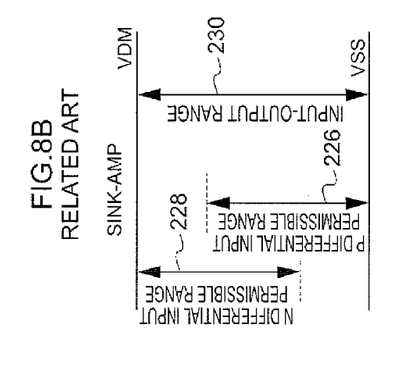
FIG. 8B is a figure showing an input-permissible-range of a differential circuit of a conventional sink amplifier and input-output ranges of the sink amplifier.

In a similar manner, regarding the sink amplifier 204, as shown in FIG. 8B, an input-permissible-range 226 of the differential pair P2 of the sink amplifier 204 and an input-permissible-range 228 of the differential pair N2 is narrower in relation to an input-permissible-range 230 of the sink amplifier 204. Consequently, as in the drive circuit 200 shown in FIG. 7, the differential circuit 214 should be configured with the two differential pairs of the differential pair P2 and N2, and the output voltage of the sink amplifier 204 is required to be of a so-called rail-to-rail type, in which all of the output voltage of the sink amplifier 204 up to the full source voltage can be extracted.

Since the input-permissible-range of the differential circuit 208 in the source amplifier 202 is in the range from the voltage VDM to the voltage VDD, as shown in FIG. 8A, medium voltage MOS transistors can be employed for the PMOS transistors and the NMOS transistors configuring the two differential pairs of the differential circuit 208.

In a similar manner, with respect to the sink amplifier 204, since the input-permissible-range of the differential circuit 214 of the sink amplifier 204 is in the range from the voltage VSS to the voltage VDD, as shown in FIG. 8B, medium voltage MOS transistors can be employed for the PMOS transistors and the NMOS transistors configuring the two differential pairs of the differential circuit 214.

When a rail-to-rail configuration is adopted to each of the differential circuits in the amplifiers in this manner, even though the differential circuits of each of the amplifiers can be configured with medium voltage MOS transistors for the differential circuits of each of the amplifiers, the issue arises that the layout surface area becomes large since two differential pairs are required for each of the amplifiers.

INTRODUCTION TO THE INVENTION

The present disclosure provides an operational amplifier in which layout surface area of the circuit can be made smaller, and a display panel driving device of the same.

A first aspect of the present disclosure is an operational amplifier including: an output circuit that outputs a voltage in a voltage range determined either from a highest voltage that is an upper limit of a predetermined power source range, or from a lowest voltage that is a lower limit of the predetermined power source range, to an intermediate voltage that is a voltage between the highest voltage and the lowest voltage; and a differential circuit comprising a first MOS transistor to which a driving signal for driving a display cell of a display panel is input and a second MOS transistor to which a given input signal is input, the first MOS transistor and the second MOS transistor being connected in parallel, and a differential input-permissible-range of the differential circuit being larger than the voltage range of the output circuit.

The differential circuit here has a differential pair, formed from the first MOS transistor and the second MOS transistor, configured in a single stage, and the differential input-permissible-range of the differential circuit is wider than the voltage range of the output circuit. Consequently, the layout surface area of the circuit can be made smaller in comparison to differential pairs configured in two stages in which the differential input-permissible-range is narrower than the voltage range of the output circuit.

In the above aspect, the first MOS transistor and the second MOS transistor may be NMOS transistors, and the differential input-permissible-range may have an upper limit of the highest voltage and a lower limit of a given voltage between the lowest voltage and the intermediate voltage.

In the above aspect, the first MOS transistor and the second MOS transistor may be PMOS transistors, and the differential input-permissible-range may have an upper limit of a given voltage between the highest voltage and the intermediate voltage and a lower limit of the lowest voltage.

In the above aspect, a current mirror circuit may be provided between the differential circuit and the output circuit.

In such a case, the voltage range of the current mirror circuit may be the same as the voltage range of the output circuit.

Another aspect of the present disclosure is a driving device for a display panel, the driving device including a high voltage side operational amplifier and a low voltage side operational amplifier. The high voltage side operational amplifier includes a high voltage side output circuit that outputs a voltage between a highest voltage that is an upper limit of a predetermined power source range, and a first intermediate voltage that is a voltage between the highest voltage and a lowest voltage that is a lowest limit of the power source range, and a high voltage side differential circuit comprising a first NMOS transistor to which a high voltage side driving signal for driving a display cell of a display panel is input and a second NMOS transistor input to which a given first input signal is input, the first NMOS transistor and the second NMOS transistor being connected in parallel and a differential input-permissible-range of the high voltage side differential circuit having an upper limit of the highest voltage and a lower limit of a given voltage between the lowest voltage and the first intermediate voltage. The low voltage side operational amplifier includes a low voltage side output circuit that outputs a voltage between the lowest voltage and a second intermediate voltage that is a voltage between the highest voltage and the lowest limit, and a low voltage side differential circuit comprising a first PMOS transistor to which a low voltage side driving signal for driving a display cell of a display panel is input and a second PMOS transistor to which a given second input signal is input, the first PMOS transistor and the second PMOS transistor being connected in parallel and a differential input-permissible-range of the low voltage side differential circuit having an upper limit of a given voltage between the highest voltage and the second intermediate voltage and a lower limit of the lowest voltage.

The high voltage side differential circuit here has a differential pair, of the first NMOS transistor and the second NMOS transistor, configured in a single stage, and the differential input-permissible-range thereof is wider than the voltage range of the high voltage side output circuit. Also, the low voltage side differential circuit has a differential pair, of the first PMOS transistor and the second PMOS transistor, configured in a single stage, and the differential input-permissible-range thereof is wider than the voltage range of the low voltage side output circuit. Consequently, the layout surface area of the circuit can be made smaller in comparison to configuration with two stages of differential pairs in which the differential input-permissible-range is narrower than the voltage range of the output circuit are provided with respect to each of the differential circuits.

In the above aspect, the first intermediate voltage may be lower than the second intermediate voltage.

In the above aspect, a high voltage side current mirror circuit may be provided between the high voltage side differential circuit and the high voltage side output circuit, and a low voltage side current mirror circuit may be provided between the low voltage side differential circuit and the low voltage side output circuit.

In the above aspect, the voltage range of the high voltage side current mirror circuit may be the same as the voltage range of the high voltage side output circuit, and the voltage range of the low voltage side current mirror circuit may be the same as the voltage range of the low voltage side output circuit.

BRIEF DESCRIPTION OF THE DRAWINGS

Exemplary embodiments of the present disclosure will be described in detail based on the following figures, wherein.

DETAILED DESCRIPTION

The exemplary embodiments of the present disclosure are described and illustrated below to encompass an operational amplifier and to a driving device for a display panel, and in particular to a display panel driving device of a liquid crystal panel or the like, and an operational amplifier employed in such a driving device. Of course, it will be apparent to those of ordinary skill in the art that the preferred embodiments discussed below are exemplary in nature and may be reconfigured without departing from the scope and spirit of the present disclosure. However, for clarity and precision, the exemplary embodiments as discussed below may include optional steps, methods, and features that one of ordinary skill should recognize as not being a requisite to fall within the scope of the present disclosure.

Figure 1:
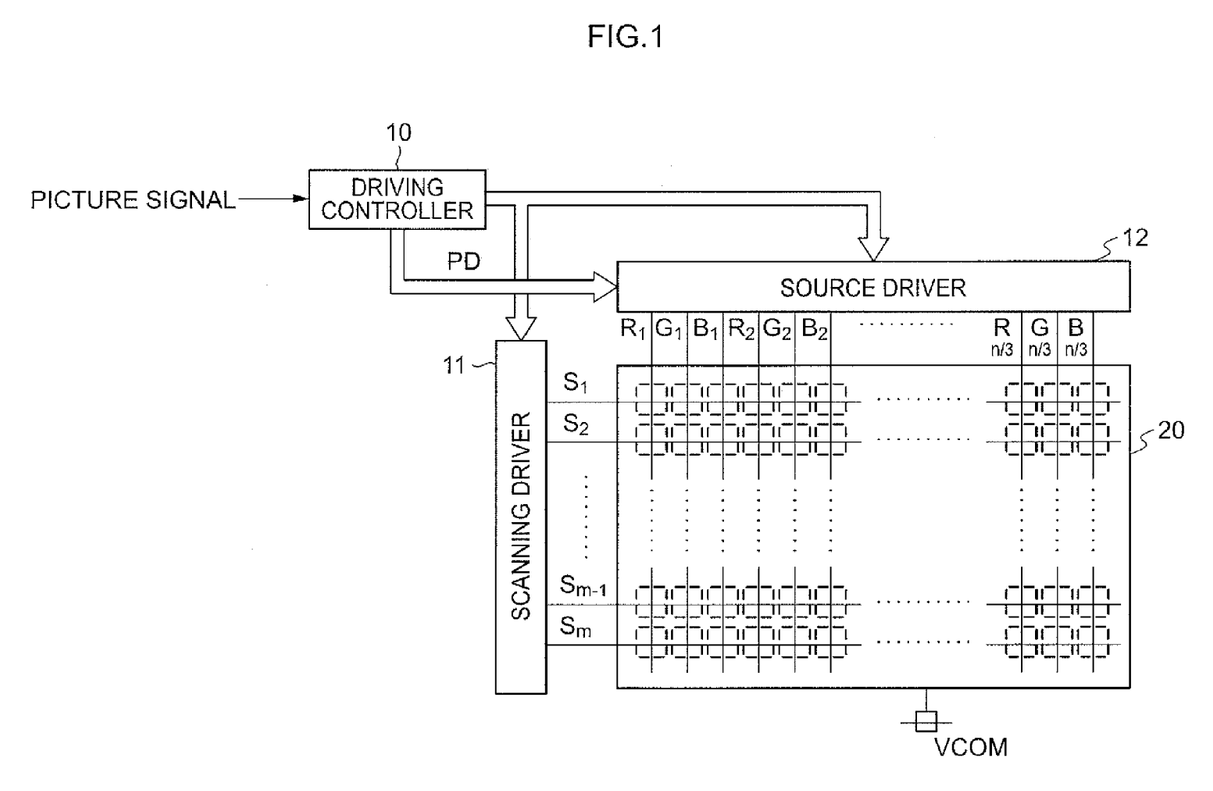
FIG. 1 is a figure showing a schematic configuration of a liquid crystal display device of an exemplary embodiment.

FIG. 1 shows a schematic configuration of a liquid crystal display device, provided with a source driver as a display panel driving device according to an exemplary embodiment.

As shown in FIG. 1, the liquid crystal display device is configured from a driving controller 10, a scanning driver 11, a source driver 12, and a display panel 20, as a color thin film transistor (TFT) liquid crystal panel.

The display panel 20 is configured with a liquid crystal layer (not shown in the drawings) to be driven, formed with in individual scan lines $S_l$ to $S_m$ that each respectively extend in a horizontal direction of a two-dimensional screen, and n individual source lines that each respectively extent in a vertical direction of a two-dimensional screen (red source lines $R_1$ to $R_{n/3}$, green source lines $G_1$ to $G_{n/3}$, blue source lines $B_1$ to $B_{n/3}$). Display cells are also formed at regions of mutually intersecting portions of the scan lines and the source lines (regions shown surrounded in intermittent lines) and function as single pixels (a red pixel, a green pixel or a blue pixel). Each of the display cells includes a transistor (not shown in the drawings) that is switched to the ON state according to a scan pulse supplied from the scanning driver 11 via a scan line. These transistors, when in the ON state, apply a pixel driving electrical potential, supplied from the source driver 12 via a source line, to one of the electrodes of respective electrodes on either side of the liquid crystal layer (not shown in the drawings). A specific reference electrical potential VCOM is constantly applied the other of the respective electrodes on either side of the liquid crystal layer. Each of the display cells displays a brightness corresponding to the voltage arising due to the pixel driving electrical potential and the reference electrical potential VCOM.

The driving controller 10 generates, based on an input picture signal, a frame synchronization signal that indicates a driving timing for each frame, and various driving control signals (described below). These signals are supplied to the scanning driver 11 and to the source driver 12. In addition, the driving controller 10, based on the input picture signal, sequentially generates pixel data PD representing the brightness level of each of the pixels, for example in 8-bits, and supplies six sets of the pixel data PD at a time to the source driver 12.

Namely, from the respective pixel data PD corresponding to each of the pixels on one scan line, the driving controller 10 supplies pixel data PD for red pixels arrayed at odd numbered columns of the columns as a pixel data series $P_{R1}$, and pixel data PD for the even numbered columns thereof as pixel data series $P_{R2}$, to the source driver 12. Also, from the pixel data PD corresponding to each of the pixels on one scan line, the driving controller 10 supplies pixel data PD for green pixels arrayed at odd numbered columns of the columns as a pixel data series $P_{G1}$, and pixel data PD for the even numbered columns thereof as a pixel data series $P_{G2}$, to the source driver 12. In addition, from the pixel data PD corresponding to each of the pixels on one scan line, the driving controller 10 supplies pixel data PD for the blue pixels arrayed at odd numbered columns of the columns as a pixel data series $P_{B1}$, and pixel data PD for the even numbered columns thereof as a pixel data series $P_{B2}$, to the source driver 12.

Figure 2:
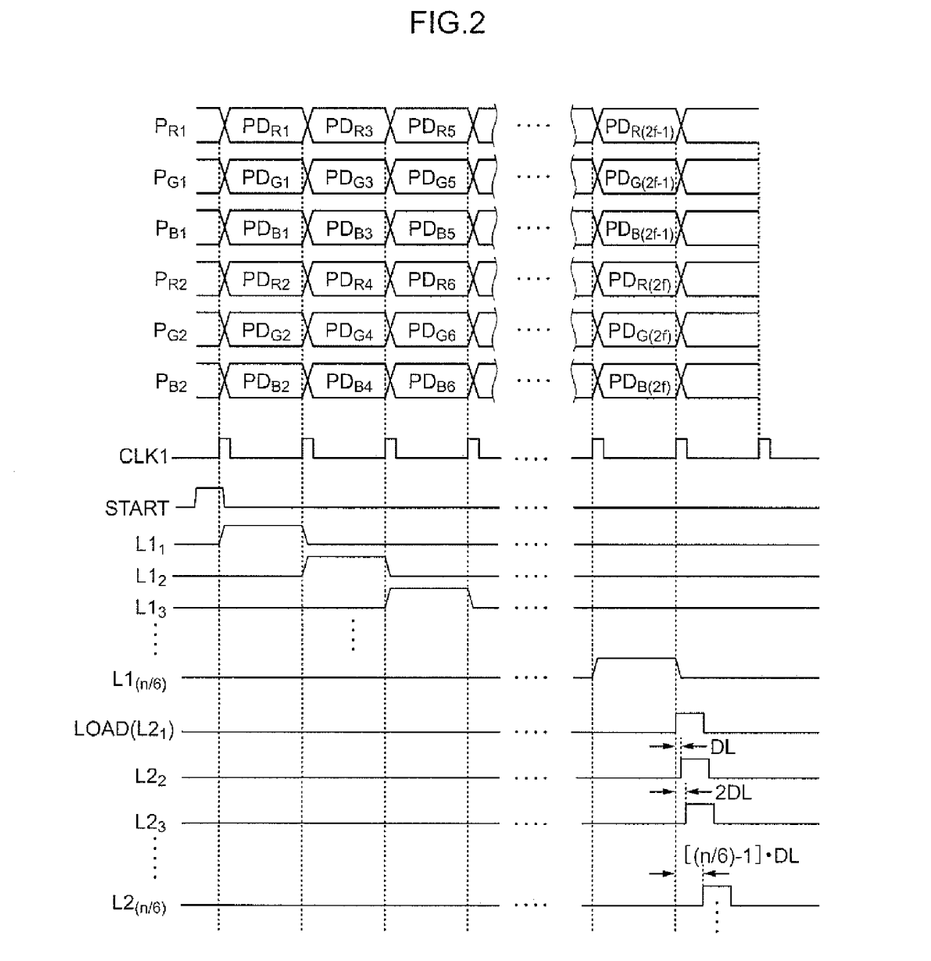
FIG. 2 is a figure showing an example of operation of a driving device of an exemplary embodiment.

For example, as shown in FIG. 2, in accordance with the first clock pulse of clock signal CLK1, the driving controller 10 supplies $PD_{R1}$ as the first pixel data PD in the pixel data series $P_{R1}$, $PD_{G1}$ as the first pixel data PD in the pixel data series $P_{G1}$, $PD_{B1}$ as the first pixel data PD in the pixel data series $P_{B1}$, $PD_{R2}$ as the first pixel data PD in the pixel data series $P_{R2}$, $PD_{G2}$ as the first pixel data PD in the pixel data series $P_{G2}$, and $PD_{B2}$ as the first pixel data PD in the pixel data series $P_{B2}$, each at the same time to the source driver 12.

Next, in accordance with the second clock pulse of clock signal CLK1, the driving controller 10 supplies $PD_{R3}$ as the second pixel data PD in the pixel data series $P_{R1}$, $PD_{G3}$ as the second pixel data PD in the pixel data series $P_{G1}$, $PD_{B3}$ as the second pixel data PD in the pixel data series $P_{B1}$, $PD_{R4}$ as the second pixel data PD in the pixel data series $P_{R2}$, $PD_{G4}$ as the second pixel data PD in the pixel data series $P_{G2}$, and $PD_{B4}$ as the second pixel data PD in the pixel data series $P_{B2}$, each at the same time to the source driver 12.

Next, in accordance with the third clock pulse of clock signal CLK1, the driving controller 10 supplies $PD_{R5}$ as the third pixel data PD in the pixel data series $P_{R1}$, $PD_{G5}$ as the third pixel data PD in the pixel data series $P_{G1}$, $PD_{B5}$ as the third pixel data PD in the pixel data series $P_{B1}$, $PD_{R6}$ as the third pixel data PD in the pixel data series $P_{R2}$, $PD_{G6}$ as the third pixel data PD in the pixel data series $P_{G2}$, and $PD_{B6}$ as the third pixel data PD in the pixel data series $P_{B2}$, each at the same time to the source driver 12.

The scanning driver 11, generates a scan pulse with a given peak voltage according to the frame synchronization signal supplied from the driving controller 10, and applies this scan pulse to each of the scan lines $S_l$ to $S_m$ of the display panel 20, sequentially and selectively.

The source driver 12 receives the pixel data PD for each of the pixels formed of the six sets of pixel data series supplied from the driving controller 10, namely including the pixel data series $P_{R1}$, $P_{G1}$, $P_{B1}$, $P_{R2}$, $P_{G2}$, and $P_{B2}$, and generates a driving pulses, with a peak electrical potential corresponding to the brightness level represented by each pixel data PD, one scan line's worth (n pixels' worth) at a time. When this occurs, the source driver 12 synchronizes with each of the scan pulses, and applies the one scan line's worth (n pixels' worth) of driving pulses, corresponding to each of the pixels belonging to the scan line to which the scan pulse is to be applied, to the corresponding respective source lines ($R_1$ to $R_{n/3}$, $G_1$ to $G_{n/3}$, $B_1$ to $B_{n/3}$).

Figure 3:
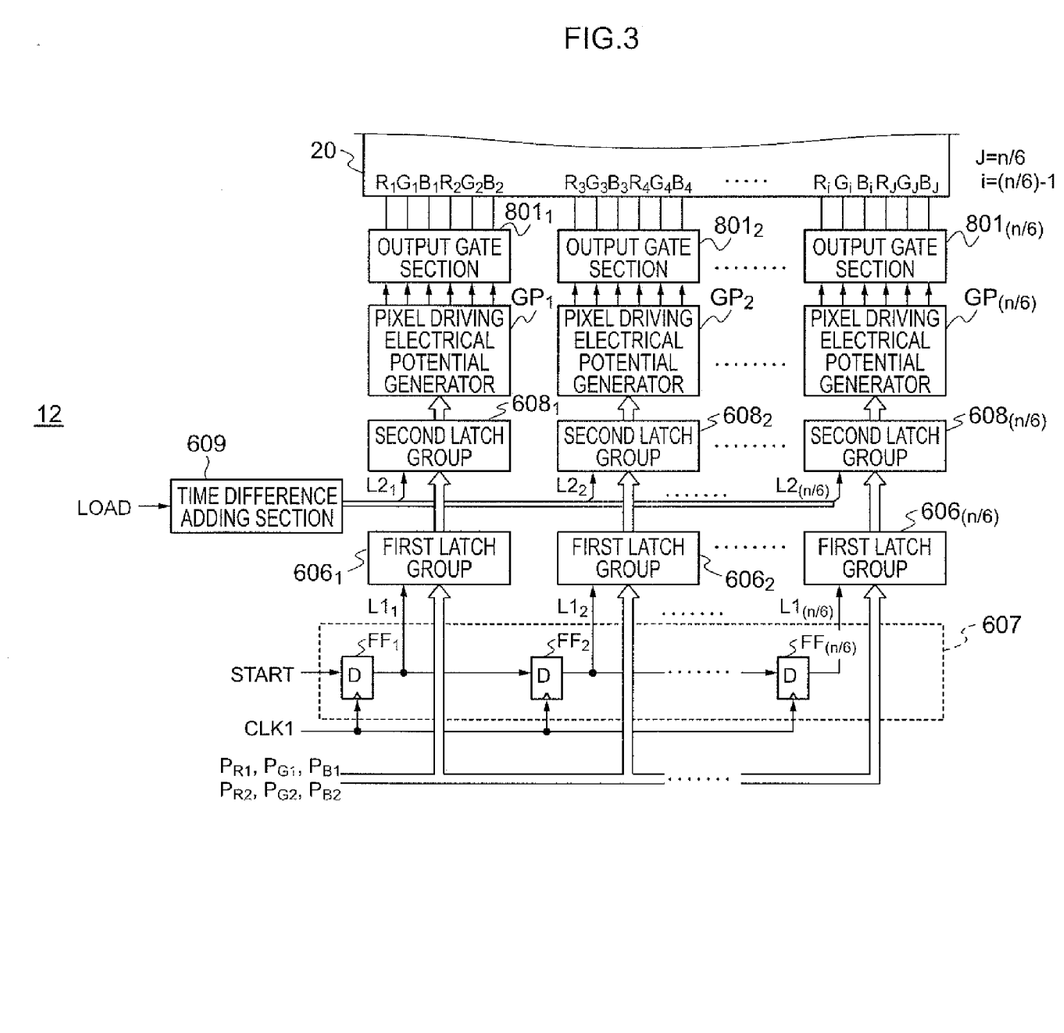
FIG. 3 is a figure showing a configuration of a source driver 12 of an exemplary embodiment.

FIG. 3 is a diagram showing a schematic configuration of the source driver 12.

As shown in FIG. 3, the source driver 12 is configured from first latch groups $606_1$ to $606_{(n/6)}$, a shift register 607, second latch groups $608_1$ to $608_{(n/6)}$, a time difference adding section 609, pixel driving electrical potential generators $GP_1$ to $GP_{(n/6)}$, and output gate sections $801_1$ to $801_{(n/6)}$.

Figure 4:
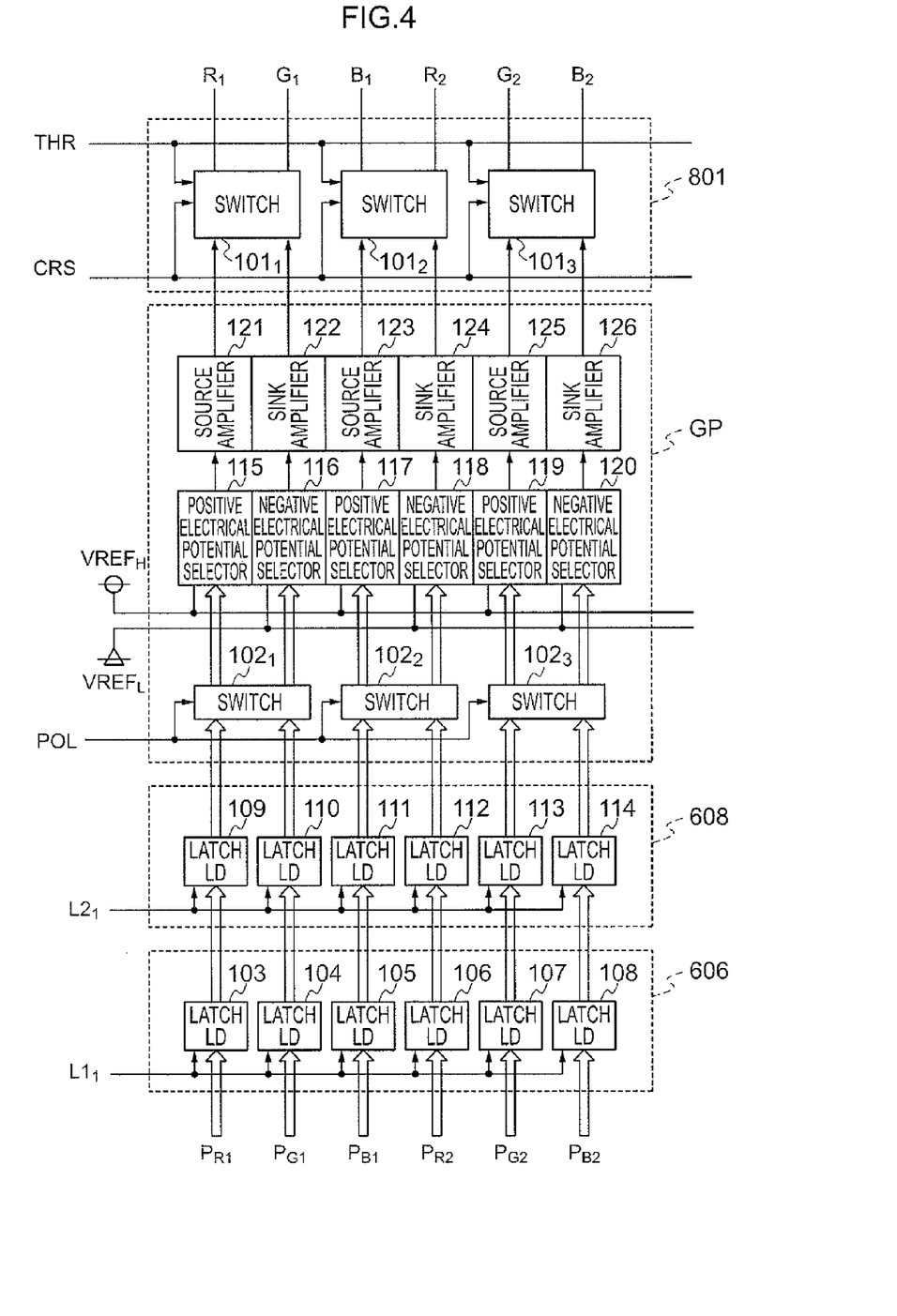
FIG. 4 is a figure showing an internal configuration of a first latch group, second latch group, pixel driving electrical potential generator, and an output gate section of an exemplary embodiment.

FIG. 4 is a diagram showing, from the configuration shown in FIG. 3, the internal configuration of each of the modules of the first latch group $606_1$, the second latch group $608_1$, the pixel driving electrical potential generator $GP_1$, and the output gate section $801_1$.

The shift register 607 is configured from flip-flops $FF_1$ to $FF_{(n/6)}$ that, each time the driving controller 10 outputs a START signal when it commences one scan line's worth of driving operation as shown in FIG. 2, shift the START signal to the following stage in accordance with the clock signal CLK1. When this is performed, the output signals from each of the flip-flops $FF_1$ to $FF_{(n/6)}$ are supplied as first load signals $L1_1$ to $L1_{(n/6)}$, as shown in FIG. 2, to the corresponding first latch groups $606_1$ to $606_{(n/6)}$, respectively.

The first latch groups $606_1$ to $606_{(n/6)}$ each have the same internal configuration, namely, are configured from latches 103 to 108, as shown in FIG. 4. The latches 103 to 108 take in and store pixel data PD from each of the respective pixel data series $P_{R1}$, $P_{G1}$, $P_{B1}$, $P_{R2}$, $P_{G2}$, $P_{B2}$ in accordance with the first load signal L1 supplied from the shift register 607, and output these sets of pixel data PD to the second latch groups 608.

For example, in accordance with the first load signal $L1_1$ shown in FIG. 2, the latches 103 to 108 of the first latch group $606_1$ respectively take in the first pixel data $PD_{R1}$ in the pixel data series $P_{R1}$, the first pixel data $PD_{G1}$ in the pixel data series $P_{G1}$, the first pixel data $PD_{B1}$ in the pixel data series $P_{B1}$, the first pixel data $PD_{R2}$ in the pixel data series $P_{R2}$, the first pixel data $PD_{G2}$ in the pixel data series $P_{G2}$, and the first pixel data $PD_{B2}$ in the pixel data series $P_{B2}$, store this pixel data, and output this pixel data to the second latch group $608_1$.

Further, for example, the latches 103 to 108 of the first latch group $606_2$ respectively take in, in accordance with the first load signal $L1_2$ shown in FIG. 2, the second pixel data $PD_{R3}$ in the pixel data series $P_{R1}$, the second pixel data $PD_{G3}$ in the pixel data series $P_{G1}$, the second pixel data $PD_{B3}$ in the pixel data series $P_{B1}$, the second pixel data $PD_{R4}$ in the pixel data series $P_{R2}$, the second pixel data $PD_{G4}$ in the pixel data series $P_{G2}$, and the second pixel data $PD_{B4}$ in the pixel data series $P_{B2}$, store this pixel data, and output this pixel data to the second latch group $608_2$.

Furthermore, for example, the latches 103 to 108 of the first latch group $606_3$ respectively take in, in accordance with the first load signal $L1_3$ shown in FIG. 2, the third pixel data $PD_{R5}$ in the pixel data series $P_{R1}$, the third pixel data $PD_{G5}$ in the pixel data series $P_{G1}$, the third pixel data $PD_{B5}$ in the pixel data series $P_{B1}$, the third pixel data $PD_{R6}$ in the pixel data series $P_{R2}$, the third pixel data $PD_{G6}$ in the pixel data series $P_{G2}$, and the third pixel data $PD_{B6}$ in the pixel data series $P_{B2}$, store this pixel data, and output this pixel data to the second latch group $608_3$.

In continuation, when each of the first latch groups $606_4$ to $606_{(n/6)}$ have taken in the pixel data PD in sequence according to the first load signals $L1_1$ to $L1_{(n/6)}$ shown in FIG. 2, namely when one scan line's worth of pixel data PD has been taken into each of the first latch groups $606_1$ to $606_{(n/6)}$, the driving controller 10 supplies load signals LOAD as shown in FIG. 2 to the time difference adding section 609.

Figure 5:
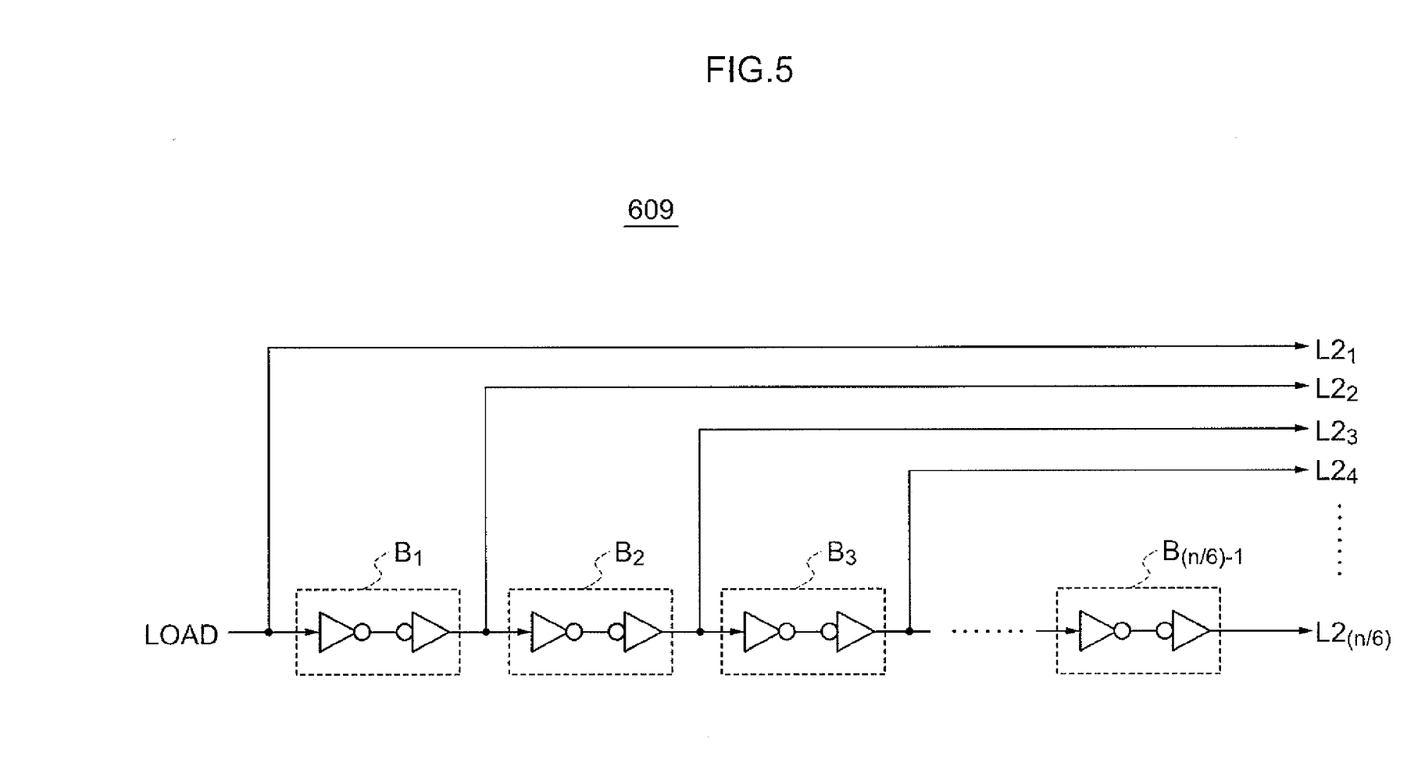
FIG. 5 is a figure showing an example of an internal configuration of a time difference adding section of an exemplary embodiment.

As shown in FIG. 2, the time difference adding section 609 supplies the load signal LOAD unmodified as a second load signal $L2_1$ to the second latch group $608_1$, and outputs this load signal LOAD respectively at different times as the second load signals $L2_2$ to $L2_{(n/6)}$ to the respective second latch groups $608_2$ to $608_{(n/6)}$. For example, the time difference adding section 609 is configured, as shown in FIG. 5, from buffers $B_1$ to $B_{(n/6)-1}$ that are each formed from two inverter elements connected together in series. The output of each of the buffers $B_1$ to $B_{(n/6)-1}$ are the respective second load signals $L2_2$ to $L2_{(n/6)}$. Each of the buffers $B_1$ to $B_{(n/6)-1}$ output the input signal after elapse of delay time DL, two inverter element's worth, and function as so-called delay elements. The second load signal $L2_2$ is thereby output with a delay of DL with respect to the second load signal $L2_1$, the second load signal $L2_3$ is output with a delay of 2×DL with respect to the second load signal $L2_1$, and the second load signal $L2_{(n/6)}$ is output with a delay of ((n/6)−1)×DL with respect to the second load signal $L2_1$.

Each of the second latch groups $608_1$ to $608_{(n/6)}$ are of similar internal configuration, namely are configured from latches 109 to 114, like those shown in FIG. 4. In accordance with the second load signals L2, the latches 109 to 114 take in and store pixel data PD supplied from the respective latches 103 to 108 of the previous stage first latch groups 606, and output this pixel data to the pixel driving electrical potential generators GP.

For example, the latches 109 to 114 of the second latch group $608_1$ take in, in accordance with the second load signal $L2_1$ as shown in FIG. 2, the respective pixel data PD supplied from each of the respective latches 103 to 108 of the first latch group $606_1$ at the same time as the load signal LOAD, store the pixel data, and output the pixel data to the pixel driving electrical potential generator $GP_1$.

Further, the latches 109 to 114 of the second latch group $608_2$ take in, in accordance with the second load signal $L2_2$ as shown in FIG. 2, the respective pixel data PD supplied from each of the respective latches 103 to 108 of the first latch group $606_2$, with a timing delayed by delay time DL with respect to the second load signal $L2_1$, store the pixel data, and output the pixel data to the pixel driving electrical potential generator $GP_2$.

Furthermore, the latches 109 to 114 of the second latch group $608_3$ take in, in accordance with the second load signal $L2_3$ as shown in FIG. 2, the respective pixel data PD supplied from each of the respective latches 103 to 108 of the first latch group $606_3$, with a timing delayed by 2× delay time DL with respect to the second load signal $L2_1$, store the pixel data, and output the pixel data to the pixel driving electrical potential generator $GP_3$.

Subsequently, each of the first latch groups $608_4$ to $608_{(n/6)}$ take in the pixel data PD, in sequence according to the second load signals $L2_4$ to $L2_{(n/6)}$ shown in FIG. 2.

In this manner, when all of one scan line's worth of pixel data PD has been input to each of the first latch groups $606_1$ to $606_{(n/6)}$, the second latch groups $608_1$ to $608_{(n/6)}$ sequentially take in the one scan line's worth of respective pixel data PD, in sets of six pixel data PD at a time with a given time difference (DL), and output the pixel data PD. In other words, the timing at which the pixel data PD is input to each of the second latch groups $608_1$ to $608_{(n/6)}$ is intentionally offset by the time difference adding section 609. Thereby, there is no sudden power surge generated at the second latch groups $608_1$ to $608_{(n/6)}$, even if many bit inversions are generated for the one scan line's worth of the data input thereto the previous time.

The pixel driving electrical potential generators $GP_1$ to $GP_{(n/6)}$ are each of a similar internal configuration, namely include, as shown in FIG. 4, switches $102_1$ to $102_3$, positive electrical potential selectors 115, 117, 119, negative electrical potential selectors 116, 118, 120, source amplifiers 121, 123, 125, and sink amplifiers 122, 124, 126.

The switch $102_1$ ($102_2$, $102_3$) supplies, in accordance with a polarity signal POL supplied from the driving controller 10, one of the pixel data PD supplied from the latch 109 (111, 113) and the pixel data PD supplied from the latch 110 (112, 114) of the second latch groups 608 to the positive electrical potential selector 115 (117, 119) or the negative electrical potential selectors 116 (118, 120), and supplies the other one of the pixel data PD to the other of the selectors. For example, when the polarity signal POL is "H", the switch $102_1$ supplies the pixel data PD supplied from the latch 109 of the second latch groups 608 to the positive electrical potential selector 115, and supplies the pixel data PD supplied from the latch 110 to the negative electrical potential selector 116. However, when the polarity signal POL is "L", the switch $102_1$ supplies the pixel data PD supplied from the latch 109 of the second latch groups 608 to the negative electrical potential selector 116, and supplies the pixel data PD supplied from the latch 110 of the second latch groups 608 to the positive electrical potential selector 115.

The positive electrical potential selector 115 (117, 119) selects, from electrical potentials that have been divided at reference electrical potential $VREF_H$ that are higher than the reference electrical potential VCOM and at reference electrical potential $VREF_L$ that are lower than the reference electrical potential VCOM, an electrical potential which is higher than the reference electrical potential VCOM and corresponds to the brightness level represented by the pixel data PD supplied from the switch $102_1$ ($102_2$, $102_3$). The positive electrical potential selector 115 (117, 119) supplies this selected electrical potential as a positive polarity brightness electrical potential PV to the source amplifier 121 (123, 125).

The negative electrical potential selector 116 (118, 120) selects from the electrical potentials that have been divided at the reference electrical potentials $VREF_H$ and $VREF_L$, an electrical potential which is lower than the reference electrical potential VCOM and corresponds to the brightness level represented by the pixel data PD supplied from the switch $102_1$ ($102_2$, $102_3$). The negative electrical potential selector 116 (118, 120) then supplies this selected electrical potential as a negative polarity brightness electrical potential NV to the sink amplifier 122 (124, 126).

The source amplifier 121 (123, 125) amplifies the supplied positive polarity brightness electrical potential PV to obtain an electrical potential for driving the liquid crystal layer of the display panel 20, and supplies this electrical potential, as a pixel driving electrical potential corresponding to each of the pixels, to the switches ($101_1$ to $101_3$) of the output gate sections ($801_1$ to $801_{(n/6)}$.

The sink amplifier 122 (124, 126) amplifies the supplied negative polarity brightness electrical potential NV to obtain an electrical potential for driving the liquid crystal layer of the display panel 20, and supplies this electrical potential, as a pixel driving electrical potential corresponding to each of the pixels to the switches ($101_1$ to $101_3$) of the output gate sections ($801_1$ to $801_{(n/6)}$).

The switch $101_1$ ($101_2$, $101_3$) outputs, in accordance with polarity signals THR and CRS supplied from the driving controller 10, output signals of the source amplifiers (121, 123, 125) and sink amplifiers (122, 124, 126) to the respective source lines ($R_1$ to $R_{n/3}$, $G_1$ to $G_{n/3}$, $B_1$ to $B_{n/3}$). Specifically, for example, when the polarity signal THR is "H" (high level) and the polarity signal CRS is "L" (low level), the switch $101_1$ ($101_2$, $101_3$) outputs the output signal from the source amplifier 121 (123, 125) to the source line $R_1$($B_1$, $G_2$) and also outputs the output signal from the sink amplifier 122 (124, 126) to the source line $G_1$ ($R_2$, $B_2$). However, if the polarity signal THR is "L" and the polarity signal CRS is "H", the switch $101_1$ ($101_2$, $101_3$) outputs the output signal from the source amplifier 121 (123, 125) to the source line $G_1$ ($R_2$, $B_2$) and also outputs the output signal from the sink amplifier 122 (124, 126) to the source line $R_1$ ($B_1$, $G_2$).

In this manner, in the pixel driving electrical potential generators GP, based on the input picture signal, the brightness level of each of the pixels is converted into the negative polarity brightness electrical potential NV, or the positive polarity brightness electrical potential PV, corresponding to that brightness level, and thereby a pixel driving electrical potential to be applied to each of the pixels via the source lines ($R_1$ to $R_{n/3}$, $G_1$ to $G_{n/3}$, $B_1$ to $B_{n/3}$) is generated. When this is performed in the pixel driving electrical potential generators GP, for any adjacent pixels, if the pixel driving electrical potential corresponding to one thereof is a negative polarity brightness electrical potential NV, then the pixel driving electrical potential corresponding to the other thereof will be a positive polarity brightness electrical potential PV.

For example, when the polarity signal POL is "H", the pixel data PD output from the latch 109 of the second latch groups 608 is supplied to the positive electrical potential selector 115 via the switch $102_1$, and the positive polarity brightness electrical potential PV obtained at the positive electrical potential selector 115 is output to the source amplifier 121. Further, when the polarity signal POL is "H", the pixel data PD output from the latch 110 of the second latch groups 608 is supplied to the negative electrical potential selector 116 via the switch $102_1$, and the negative polarity brightness electrical potential NV obtained at the negative electrical potential selector 116 is output to the sink amplifier 122. Namely, in this case, a pixel driving electrical potential that corresponds to the positive polarity brightness electrical potential PV is output from the source amplifier 121, and a pixel driving electrical potential that corresponds to the negative polarity brightness electrical potential NV is output from the sink amplifier 122, which is associated with the pixel adjacent to the pixel that is associated with the source amplifier 121.

However, when the polarity signal POL is "L", the pixel data PD output from the latch 109 of the second latch groups 608 is supplied to the negative electrical potential selector 116 via the switch $102_1$, and the negative polarity brightness electrical potential NV obtained at the negative electrical potential selector 116 is output to the source amplifier 121 through the switch $101_1$. When the polarity signal POL is "L", the pixel data PD output from the latch 110 of the second latch groups 608 is supplied to the positive electrical potential selector 115 via the switch $102_1$, and the positive polarity brightness electrical potential PV obtained at the positive electrical potential selector 115 is output to the sink amplifier 122. Namely, in this case, a pixel driving electrical potential corresponding to a negative polarity brightness electrical potential NV is output from the source amplifier 121, and a pixel driving electrical potential corresponding to a positive polarity brightness electrical potential PV is output from the sink amplifier 122. When the above pixel driving electrical potentials are applied to one of the electrodes on either side of the liquid crystal layer of the display panel 20, the fixed reference electrical potential VCOM, which is higher than the negative polarity brightness electrical potential NV and lower than the positive polarity brightness electrical potential PV, is supplied to the other of the electrodes. Consequently, when the positive polarity brightness electrical potential PV is applied as the pixel driving electrical potential, a driving voltage of positive polarity is applied to the liquid crystal layer of the display panel 20, and when the negative polarity brightness electrical potential NV is applied as the pixel driving electrical potential, a driving voltage of negative polarity is applied to the liquid crystal layer of the display panel 20.

In other words, in the pixel driving electrical potential generators GP, on generation of a pixel driving electrical potential to be applied to each of the pixels via the source lines ($R_1$ to $R_{n/3}$, $G_1$ to $G_{n/3}$, $B_1$ to $B_{n/3}$) of the display panel 20, the polarity can be inverted for each of the adjacent pixels, and also this inverted state can be changed in accordance with the polarity signals THR, CRS.

Each of the pixel driving electrical potentials, corresponding to the respective pixels of one scan line's worth of pixels and generated by the respective pixel driving electrical potential generators $GP_1$ to $GP_{(n/6)}$, is supplied to the respective switch $101_1$, $101_2$, $101_3$ of the respective output gate sections $801_1$ to $801_{(n/6)}$.

Each of the second latch groups $608_1$ to $608_{(n/6)}$, takes in the pixel data PD at respectively different time according to the second load signals $L2_1$ to $L2_{(n/6)}$). Therefore, the output timing of each of the respective pixel driving electrical potentials output from the respective pixel driving electrical potential generators $GP_1$ to $GP_{(n/6)}$ is also offset by these time differences. Consequently, if the pixel driving electrical potentials output from the respective pixel driving electrical potential generators $GP_1$ to $GP_{(n/6)}$ are applied as they are to the display panel 20, with a capacitive characteristic such as a liquid crystal display panel, the charging load for each of the pixels would be uneven due to the above described offset of the output timing, and this might lead to a deterioration in image quality.

In order to address this issue, in the source driver 12 shown in FIG. 3 and FIG. 4, each of the respective output gate sections $801_1$ to $801_{(n/6)}$ are all set at once to the ON state after all of the pixel driving electrical potentials have been output from the respective pixel driving electrical potential generators $GP_1$ to $GP_{(n/6)}$. Thus, these respective pixel driving electrical potentials are all applied at the same time to the respective source lines ($R_1$ to $R_{n/3}$, $G_1$ to $G_{n/3}$, $B_1$ to $B_{n/3}$) of the display panel 20.

Consequently, with the source driver 12, even if the timing for taking in the pixel data of the respective second latch groups $608_1$ to $608_{(n/6)}$ is intentionally set different from each other in order to suppress a large instantaneous surge in charge, since the charging load amount due to application of one scan line's worth of the respective pixel driving electrical potentials is uniform for each of the respective pixels, there is no deterioration in image quality as described above. Namely, suppression of a large instantaneous surge in charge is enabled, without causing a deterioration in image quality.

Explanation will now be given of a specific configuration of the source amplifiers (121, 123, 125) and sink amplifiers (122, 124, 126).

First, explanation will be given of a specific configuration of the source amplifiers (121, 123, 125). Since each of the source amplifiers are of a similar configuration, explanation will only be given regarding the source amplifier 121. The same reference numerals are appended to the same portions as those of the source amplifier 202 shown in FIG. 7, and detailed explanation thereof is omitted.

Figure 6:
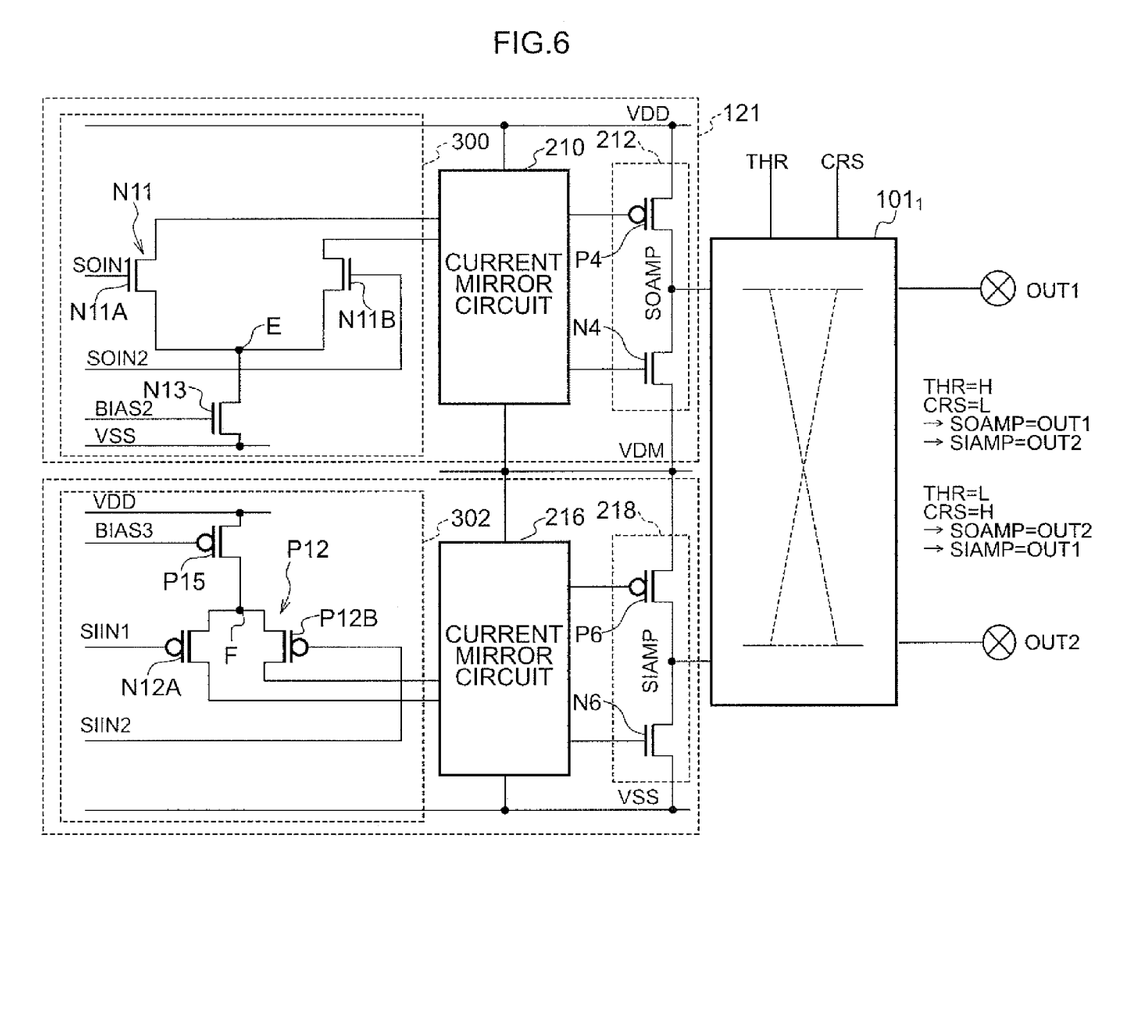
FIG. 6 is a circuit diagram of a source amplifier and a sink amplifier according to an exemplary embodiment.

As shown in FIG. 6, the source amplifier 121 includes a differential circuit 300, a current mirror circuit 210 and an output circuit 212.

The differential circuit 300 includes a differential pair N11 of NMOS transistors N11A, N11B connected in parallel to the current mirror circuit 210, and an NMOS transistor N13.

A positive polarity brightness electrical potential in accordance with the pixel data is applied as an input signal voltage SOIN1 to the gate of the NMOS transistor N11A, and a specific input signal voltage SOIN2 is input to the gate of the NMOS transistor N11B. The gate of the NMOS transistor N11B is, for example, connected to an output terminal of the source amplifier 121, and an output signal voltage SOAMP from this output terminal is applied as the input signal voltage SOIN2 to the gate of the NMOS transistor N11B. In such a case the source amplifier 121 functions as a so-called voltage follower.

A specific bias voltage BIAS2 is applied to the gate of the NMOS transistor N13, the drain of the NMOS transistor N13 is connected to a connection point E of the NMOS transistors N11A, N11B, and a voltage VSS (ground, for example, in the present exemplary embodiment) is applied to the source of the NMOS transistor N13.

Figure 8C:
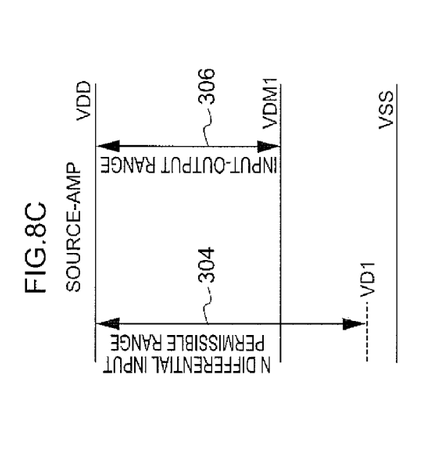
FIG. 8C is a figure showing an input-permissible-range of a differential circuit of a source amplifier of the present exemplary embodiment and input-output ranges of a source amplifier of the present exemplary embodiment.

As shown in FIG. 8C, an input-permissible-range 304 of the differential circuit 300 configured in this manner, is a range from a voltage VD1, which is higher than the voltage VSS and lower than a voltage VDM1, to the voltage VDD. Therefore, the differential circuit 300 is configured by an NMOS transistor of a higher voltage NMOS transistor in comparison to the medium voltage NMOS transistor configuring the differential circuit of the related art shown in FIG. 7. Further, as shown in FIG. 8C, an input-output range 306 of the source amplifier 121 is a range from the voltage VDM1 to the voltage VDD.

Note that since the current minor circuit 210 and the output circuit 212 are similar to the circuits shown in FIG. 7, explanation thereof is omitted.

The sink amplifier 122 includes a differential circuit 302, a current mirror circuit 216 and an output circuit 218.

The differential circuit 302 includes differential pair P12 of a PMOS transistor P12A, P12B, connected in parallel to a current mirror circuit 216, and a PMOS transistor P15.

A negative polarity brightness electrical potential in accordance with the pixel data is applied as an input signal voltage SIIN1 to the gate of the PMOS transistor P12A, and a specific input signal voltage SIIN2 is applied to the gate of the PMOS transistor P12B. The gate of the PMOS transistor P12B is, for example, connected to an output terminal of the sink amplifier 122, and an output signal voltage STAMP from this output terminal is applied as the input signal voltage SIIN2 to the gate of the PMOS transistor P12B. In such a case the sink amplifier 122 functions as a so-called voltage follower.

A specific bias voltage BIAS3 is applied to the gate of the PMOS transistor P15, the voltage VDD is applied to the source of the PMOS transistor P15, and the drain of the PMOS transistor P15 is connected to a connection point F of the PMOS transistors P12A, P12B.

Figure 8D:
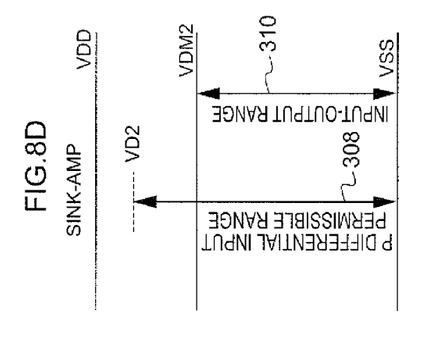
FIG. 8D is a figure showing an input-permissible-range of a differential circuit of a sink amplifier of the present exemplary embodiment and input-output ranges of a sink amplifier of the present exemplary embodiment.

As shown in FIG. 8D, the input-permissible-range 308 of the differential circuit 302 configured in this manner is a range up to a voltage VD2 that is higher than a voltage VDM2 and lower than the voltage VDD. Therefore, the differential circuit 302 is configured by a PMOS transistor of a higher voltage PMOS transistor in comparison to the medium voltage PMOS transistor configuring the differential circuit of the related art shown in FIG. 7. Further, as shown in FIG. 8D, an input-output range 310 of the sink amplifier 122 is a range from the voltage VSS up to the voltage VDM2.

Note that since the current mirror circuit 216 and the output circuit 218 are similar to the circuits shown in FIG. 7, explanation thereof is omitted.

As can be appreciated, the significant difference of the source amplifier 121 from the source amplifier 202 shown in FIG. 7 is that the differential pair is provided only in a single stage of the NMOS transistors N11A, N11B, that the voltage VSS is applied to the source of the NMOS transistor N13 rather than the voltage VDM, and that, as shown in FIG. 8C, the input-permissible-range 304 of the differential circuit 300 of the source amplifier 121 is wider than the input-output range 306 of the source amplifier 121.

Also, the significant difference of the sink amplifier 122 from the sink amplifier 204 shown in FIG. 7, is that the differential pair is only provided in a single stage of the PMOS transistors P12A, P12B, that the voltage VDD is applied to the source of the PMOS transistor P15 rather than the voltage VDM, and that, as shown in FIG. 8D, the input-permissible-range 308 of the differential circuit 302 of the sink amplifier 122 is a greater range than the input-output range 310 of the sink amplifier 122.

Since the differential circuits of each of the amplifiers are configured with the differential pairs, formed from the high voltage PMOS transistors and high voltage NMOS transistors, only in a single stage, the layout surface area of the differential circuits can be made smaller in comparison to cases configured with the differential pairs, formed from the medium voltage PMOS transistors and medium voltage NMOS transistors, in two stages, as shown in FIG. 7.

Note that, for example, even if the withstanding voltage of a high voltage MOS transistor is twice the withstanding voltage of a given medium voltage MOS transistor, the size of such a high voltage MOS transistor does not become as much as twice the size of the medium voltage MOS transistor. Consequently, the overall layout surface area of the differential circuits can be made smaller in a configuration provided with a single stage of differential pairs formed from high voltage MOS transistors than in a configuration provided with two stages of differential pairs formed from medium voltage MOS transistors.

As shown in FIG. 8C and FIG. 8D, the output range of the source amplifier 121 is a range from the intermediate voltage VDM1 (first intermediate voltage), which is intermediate between the voltage VDD and the voltage VSS, up to the voltage VDD, and the output range of the sink amplifier 122 is a range from the voltage VSS up to the intermediate voltage VDM2 (second intermediate voltage), which is intermediate between the voltage VDD and the voltage VSS. Further, the voltage VDM1 is higher than the voltage VDM2. Namely, portions of the output ranges of the source amplifier 121 and the sink amplifier 122 are configured to be mutually overlapped with each other, and consequently, as shown in FIG. 6, normal operation is achieved even if the intermediate voltage VDM (in the present exemplary embodiment 1/2 VDD) is slightly displaced. This is particularly effective, for example, in applications employing separate power source chips to supply power to the source amplifier 121 and the sink amplifier 122, where there are slight differences in the intermediate voltages supplied to the source amplifier 121 and the sink amplifier 122.

As explained above, according to the exemplary embodiment, the layout surface area of the circuit can be made smaller.

Following from the above description and embodiments, it should be apparent to those of ordinary skill in the art that, while the methods and apparatuses herein described constitute exemplary embodiments of the present disclosure, the disclosure is not necessarily limited to the precise embodiments and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure discussed herein in order to fall within the scope of any claims, since the invention is defined by the claims and since inherent and/or unforeseen advantages of the present disclosure may exist even though they may not have been explicitly discussed herein.

What is claimed is:

1. An operational amplifier comprising:
   an output circuit that outputs a voltage in a voltage range determined either from a highest voltage that is an upper limit of a predetermined power source range, or from a lowest voltage that is a lower limit of the predetermined power source range, to an intermediate voltage that is a voltage between the highest voltage and the lowest voltage; and
   a differential circuit comprising a first MOS transistor to which a driving signal for driving a display cell of a display panel is input and a second MOS transistor to which a given input signal is input, the first MOS transistor and the second MOS transistor being connected in parallel, and a differential input-permissible-range of the differential circuit being larger than the voltage range of the output circuit,
   wherein the first MOS transistor and the second MOS transistor are NMOS transistors, and the differential input-permissible-range has an upper limit of the highest voltage and a lower limit of a given voltage between the lowest voltage and the intermediate voltage.

2. The operational amplifier of claim 1, wherein the output circuit comprises an output transistor, and the first MOS transistor and the second MOS of the differential circuit are higher voltage transistors than the output transistor of the output circuit.

3. An operational amplifier comprising:
an output circuit that outputs a voltage in a voltage range determined either from a highest voltage that is an upper limit of a predetermined power source range, or from a lowest voltage that is a lower limit of the predetermined power source range, to an intermediate voltage that is a voltage between the highest voltage and the lowest voltage; and
a differential circuit comprising a first MOS transistor to which a driving signal for driving a display cell of a display panel is input and a second MOS transistor to which a given input signal is input, the first MOS transistor and the second MOS transistor being connected in parallel, and a differential input-permissible-range of the differential circuit being larger than the voltage range of the output circuit,
wherein the first MOS transistor and the second MOS transistor are PMOS transistors, and the differential input-permissible-range has an upper limit of a given voltage between the highest voltage and the intermediate voltage and a lower limit of the lowest voltage.

4. The operational amplifier of claim 3, wherein the output circuit comprises an output transistor, and the first MOS transistor and the second MOS of the differential circuit are higher voltage transistors than the output transistor of the output circuit.

5. An operational amplifier comprising:
an output circuit that outputs a voltage in a voltage range determined either from a highest voltage that is an upper limit of a predetermined power source range, or from a lowest voltage that is a lower limit of the predetermined power source range, to an intermediate voltage that is a voltage between the highest voltage and the lowest voltage;
a differential circuit comprising a first MOS transistor to which a driving signal for driving a display cell of a display panel is input and a second MOS transistor to which a given input signal is input, the first MOS transistor and the second MOS transistor being connected in parallel, and a differential input-permissible-range of the differential circuit being larger than the voltage range of the output circuit; and
a current mirror circuit provided between the differential circuit and the output circuit,
wherein the voltage range of the current mirror circuit is the same as the voltage range of the output circuit.

6. The operational amplifier of claim 5, wherein the output circuit comprises an output transistor, and the first MOS transistor and the second MOS of the differential circuit are higher voltage transistors than the output transistor of the output circuit.

7. A driving device for a display panel, the driving device comprising:
a high voltage side operational amplifier comprising
a high voltage side output circuit that outputs a voltage between a highest voltage that is an upper limit of a predetermined power source range, and a first intermediate voltage that is a voltage between the highest voltage and a lowest voltage that is a lowest limit of the power source range, and
a high voltage side differential circuit comprising a first NMOS transistor to which a high voltage side driving signal for driving a display cell of a display panel is input and a second NMOS transistor input to which a given first input signal is input, the first NMOS transistor and the second NMOS transistor being connected in parallel and a differential input-permissible-range of the high voltage side differential circuit having an upper limit of the highest voltage and a lower limit of a given voltage between the lowest voltage and the first intermediate voltage; and
a low voltage side operational amplifier comprising
a low voltage side output circuit that outputs a voltage between the lowest voltage and a second intermediate voltage that is a voltage between the highest voltage and the lowest limit, and
a low voltage side differential circuit comprising a first PMOS transistor to which a low voltage side driving signal for driving a display cell of a display panel is input and a second PMOS transistor to which a given second input signal is input, the first PMOS transistor and the second PMOS transistor being connected in parallel and a differential input-permissible-range of the low voltage side differential circuit having an upper limit of a given voltage between the highest voltage and the second intermediate voltage and a lower limit of the lowest voltage.

8. The display panel driving device of claim 7, wherein the first intermediate voltage is lower than the second intermediate voltage.

9. The display panel driving device of claim 7, further comprising:
a high voltage side current mirror circuit provided between the high voltage side differential circuit and the high voltage side output circuit; and
a low voltage side current mirror circuit provided between the low voltage side differential circuit and the low voltage side output circuit.

10. The display panel driving device of claim 9, wherein the voltage range of the high voltage side current mirror circuit is the same as the voltage range of the high voltage side output circuit, and the voltage range of the low voltage side current mirror circuit is the same as the voltage range of the low voltage side output circuit.

11. The display panel driving device of claim 10, wherein the high voltage side output circuit comprises a high voltage side output transistor, and the first NMOS transistor and the second NMOS of the high voltage side differential circuit are higher voltage transistors than the high voltage side output transistor of the high voltage side output circuit, and
wherein the low voltage side output circuit comprises a low voltage side output transistor, and the first PMOS transistor and the second PMOS transistor of the low voltage side differential circuit are higher voltage transistors than the low voltage side output transistor.

12. The display panel driving device of claim 7, wherein the high voltage side output circuit comprises a high voltage side output transistor, and the first NMOS transistor and the second NMOS of the high voltage side differential circuit are higher voltage transistors than the high voltage side output transistor of the high voltage side output circuit, and
wherein the low voltage side output circuit comprises a low voltage side output transistor, and the first PMOS transistor and the second PMOS transistor of the low voltage side differential circuit are higher voltage transistors than the low voltage side output transistor.

* * * * *